(12) United States Patent
Kim

(10) Patent No.: US 6,486,719 B2
(45) Date of Patent: Nov. 26, 2002

(54) FLIP-FLOP CIRCUITS HAVING DIGITAL-TO-TIME CONVERSION LATCHES THEREIN

(75) Inventor: Kyu-Hyoun Kim, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/935,096

(22) Filed: Aug. 22, 2001

(65) Prior Publication Data

US 2002/0024368 A1 Feb. 28, 2002

(30) Foreign Application Priority Data

Aug. 23, 2000 (KR) .......................................... 2000-48992

(51) Int. Cl.[7] .............................................. H03K 3/037
(52) U.S. Cl. ........................ 327/199; 327/211; 327/208; 327/218
(58) Field of Search ................................. 327/214, 215, 327/218, 219, 225, 256, 257, 258, 259, 199–212; 326/104, 106, 112

(56) References Cited

U.S. PATENT DOCUMENTS

| | | | | |
|---|---|---|---|---|
| 4,486,673 A | * | 12/1984 | Koike | 327/210 |
| 4,728,823 A | * | 3/1988 | Kinoshita | 326/16 |
| 4,902,909 A | * | 2/1990 | Chantepie | 327/115 |
| 4,973,978 A | | 11/1990 | Jordan | 341/152 |
| 4,980,585 A | | 12/1990 | Bazes | 307/529 |
| 4,982,111 A | * | 1/1991 | Nakaizumi | 327/208 |
| 5,036,230 A | | 7/1991 | Bazes | 307/527 |
| 5,095,225 A | * | 3/1992 | Usui | 327/211 |
| 5,103,466 A | | 4/1992 | Bazes | 375/110 |
| 5,173,870 A | * | 12/1992 | Sukashita et al. | 327/208 |
| 5,428,321 A | * | 6/1995 | Yoshida et al. | 332/10 |
| 5,489,864 A | | 2/1996 | Ashuri | 327/161 |
| 5,638,018 A | * | 6/1997 | Sharpe-Geisler | 327/199 |
| 5,663,914 A | * | 9/1997 | Kwon | 365/189.05 |
| 5,781,053 A | * | 7/1998 | Ramirez | 327/202 |
| 5,963,052 A | * | 10/1999 | Shingaki et al. | 326/37 |

FOREIGN PATENT DOCUMENTS

JP 6-260903 9/1994

\* cited by examiner

Primary Examiner—Tuan T. Lam
Assistant Examiner—Linh Nguyen
(74) Attorney, Agent, or Firm—Myers Bigel Sibley & Sajovec

(57) ABSTRACT

Flip-flop circuits having digital-to-time conversion latches therein include a pair of logic gates that each have first and second data inputs and an output. The first inputs are electrically connected together and are responsive to a latching signal. Each of the second data inputs is electrically connected to an output of the other logic gate in the pair. The pair of logic gates includes a first logic gate having first circuitry therein that, in response to a first control signal, adjusts a pull-down delay characteristic of the first logic gate. This pull-down delay characteristic is adjusted by reducing an effective on-state impedance of a first pull-down path within the first logic gate when an output of the first logic gate is being pulled from a logic 1 value to a logic 0 value by the first pull-down path.

20 Claims, 13 Drawing Sheets

FLIP-FLOP CIRCUITS HAVING DIGITAL-TO-TIME CONVERSION LATCHES THEREIN

RELATED APPLICATION

This application is related to Korean Application No. 2000-48992, filed Aug. 23, 2000, the disclosure of which is hereby incorporated herein by reference.

FIELD OF THE INVENTION

The present invention relates to semiconductor devices and methods of manufacturing semiconductor devices, and more particularly, to integrated circuit capacitors and methods of manufacturing integrated circuit capacitors.

BACKGROUND OF THE INVENTION

The width of a set-up/hold window, which means the sum of a set-up time and a hold time, is preferably narrow in order to operate a flip-flop at high speed. The set-up time is a time interval at which data must arrive earlier than the edge of a clock signal, so that the flip-flop latches valid data in synchronization with a clock signal. The hold time is a time interval for which data must be maintained for a predetermined time after the edge of the clock signal, so that data is completely latched to the inside of a latch.

The conventional flip-flop includes a flip-flop using a transmission gate as shown in FIG. 1, a flip-flop using a NAND gate as shown in FIG. 2, and a flip-flop using a sense amplifier as shown in FIG. 3.

In the flip-flop shown in FIG. 1, a difference corresponding to the delay time of an inverter 11 exists between a clock signal CLK applied to an NMOS transistor of a transmission gate T2 and a PMOS transistor of a transmission gate T1 and an inversion clock signal CLKB applied to a NMOS transistor of a transmission gate T1 and a PMOS transistor of a transmission gate T2. When data D is at a logic "high" level, the PMOS transistor of the transmission gate T1 latches the data. When the data D is at a logic "low" level, the NMOS transistor of the transmission gate T1 latches the data. Therefore, the flip-flop shown in FIG. 1 has shortcoming in that the set-up time when the data D is at the logic "high" level is longer than the set-up time when the data D is at the logic "low" level by the delay time of the inverter I1.

In order to solve this problem of asymmetric set-up time, the clock signal CLK is delayed by the delay time of the inverter I1 using a phase splitter and the delayed clock signal can be applied to the PMOS transistor of the transmission gate T1 and the NMOS transistor of the transmission gate T2. However, even in such a case, it is very difficult to precisely lock the phase of the inversion clock signal CLKB to the phase of the clock signal delayed by the delay time of the inverter I1 due to changes in fabrication process, power supply voltage, and temperature. Also, the area of the flip-flop typically increases with the addition of the phase splitter. Also, since the path of the data D is different from the path of the clock signal CLK, a change in the set-up time with respect to a change in the power supply voltage can be caused. Accordingly, the width of the set-up and hold window increases.

In the flip-flop shown in FIG. 2, the set-up time when the data D is transitioned from the logic "low" level to the logic "high" level has a value that is almost 0 since the set-up time is determined by NAND gates ND3 and ND4. The set-up time when the data D is transitioned from the logic "high" level to the logic "low" level is determined by NAND gates ND1 and ND2. Since the input A of the NAND gate ND1 is set after the delay time of the NAND gate ND4 on the basis of the data D, the set-up time when the data D is transitioned from the logic "high" level to the logic "low" level is longer than the set-up time when the data D is transitioned from the logic "low" level to the logic "high" level by the delay time of the NAND gate ND4. Therefore, the width of the set-up/hold window increases.

In the flip-flop shown in FIG. 3, SB and RB start to fall from the logic "high" level to the logic "low" level when the clock signal CLK rises to the logic "high" level. Falling speed is determined by the common mode voltages of the data D and inversion data DB. Therefore, the inclination, with which SB (or RB) is pulled-down when the data D is at the logic "high" level, is different from the inclination, with which SB (or RB) is pulled-down when the data D is at the logic "low" level. Accordingly, the hold time of a sense amplifier SA when the data D is at the logic "low" level is different from the hold time of the SA when the data D is at the logic "high" level.

SUMMARY OF THE INVENTION

Flip-flop circuits having digital-to-time conversion latches therein according to one embodiment of the present invention include a pair of logic gates that each have first and second data inputs and an output. The first inputs are electrically coupled together and are responsive to a latching signal. Each of the second data inputs is electrically connected to an output of the other logic gate in the pair. The pair of logic gates includes a first logic gate having first circuitry therein that, in response to a first control signal, adjusts a pull-down delay characteristic of the first logic gate. Thus, the value (digital or analog) of the first control signal can be used to alter the timing characteristics of the latching operation performed by the latch. This pull-down delay characteristic is adjusted by reducing an effective on-state impedance of a first pull-down path within the first logic gate when an output of the first logic gate is being pulled from a logic 1 value to a logic 0 value by the first pull-down path An integrated circuit latch according to a second embodiment of the present invention includes a pair of logic gates that each have first and second data inputs and an output, with the first inputs electrically connected together and responsive to a latching signal (e.g., CLK) and with each of the second inputs electrically connected to an output of the other logic gate in the pair. The pair of logic gates include a first logic gate having first circuitry therein that, in response to a first control signal, adjusts a delay characteristic of the first logic gate. This delay characteristic may be a pull-down or pull-up delay characteristic. The first control signal may be a single-bit digital signal, a multi-bit digital signal or an analog signal, for example.

An integrated circuit latch according to a third embodiment of the present invention includes a pair of logic gates that each have first and second data inputs and an output, with the first inputs electrically connected together and responsive to a latching signal and with each of the second inputs electrically connected to an output of the other logic gate in the pair. This pair of logic gates includes a first logic gate having first circuitry therein that, in response to a first control signal, adjusts a pull-down delay characteristic of the first logic gate. The pull-down delay characteristic is adjusted by reducing an effective on-state impedance of a first pull-down path therein when an output of said first logic gate is being pulled from a logic 1 value to a logic 0 value by the first pull-down path. In particular, the first circuitry within the first logic gate adjusts a pull-down delay characteristic of the first logic gate by reducing an effective on-state impedance of a first MOS transistor within the first pull-down path. The first logic gate may comprise a first pair of MOS transistors connected source-to-drain in a first totem-pole arrangement and the first circuitry may comprise a second pair of MOS transistors connected source-to-drain in a second totem-pole arrangement, with the second totem-pole arrangement being connected in parallel with one of the MOS transistors in the first totem-pole arrangement.

DESCRIPTION OF PREFERRED EMBODIMENTS

Figure 1:
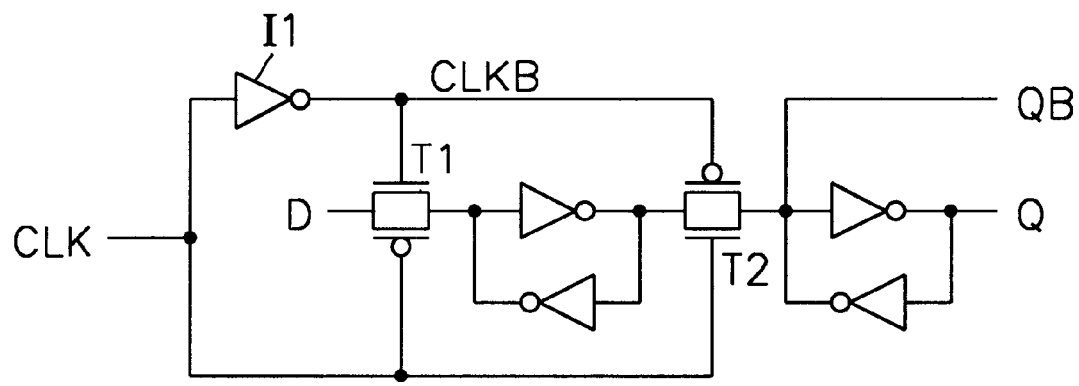
FIG. 1 is an electrical schematic of a conventional flip-flop circuit that utilizes transmission gates.
Figure 2:
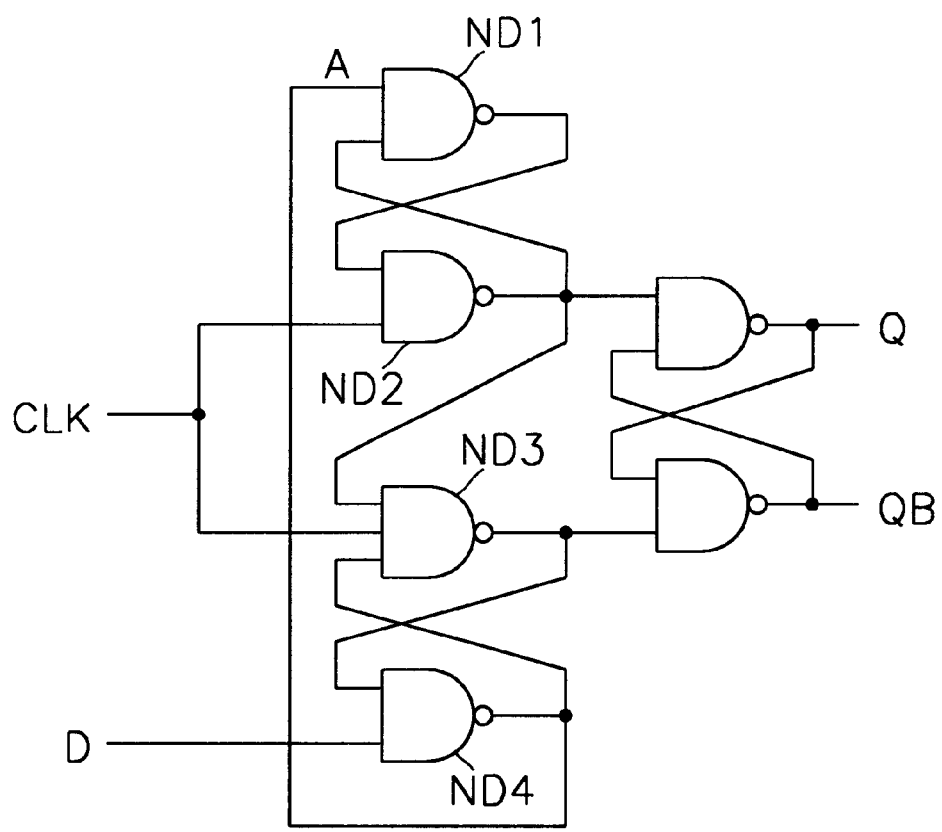
FIG. 2 is an electrical schematic of a conventional flip-flop circuit that utilizes NAND gates.
Figure 3:
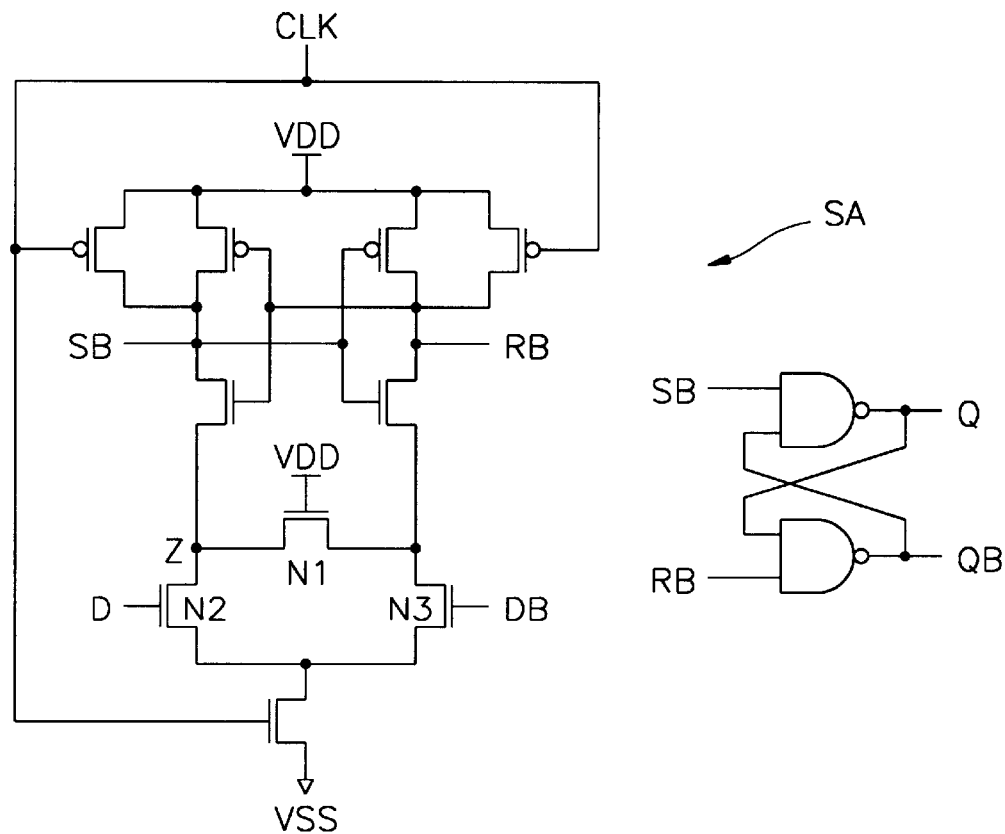
FIG. 3 is an electrical schematic of a conventional sense amplifier that can be used in a flip-flop circuit.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be through and complete, and will fully convey the scope of the invention to those skilled in the art. Like reference numerals refer to like elements throughout and signal lines and signals thereon may be referred to by the same reference characters.

Figure 4:
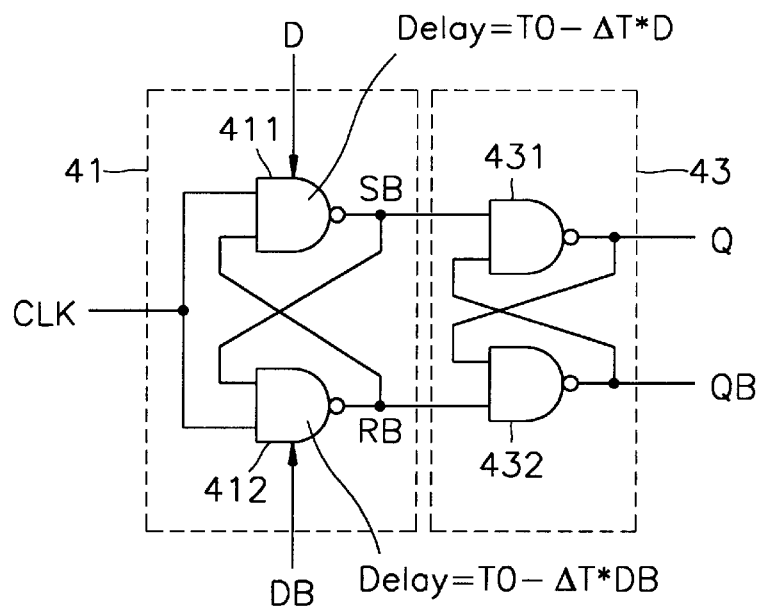
FIG. 4 is an electrical schematic of a flip-flop circuit according to a first embodiment of the present invention.

Referring now to FIG. 4, an electrical schematic of a flip-flop circuit according to a first embodiment of the present invention will be described. The flip-flop circuit comprises a first latch circuit 41 and a second latch circuit 43. The first latch circuit is illustrated as comprising a first NAND gate 411 and a second NAND gate 412, connected as illustrated. The second latch circuit 43 comprises third and fourth NAND gates 431 and 432, respectively, connected as illustrated. The second latch circuit 43 generates flip-flop output signals Q and QB, in response to signals SB and RB. As explained more fully hereinbelow, the delay of the first NAND gate 411 is a function of the logic value of a data signal D and the delay of the second NAND gate 412 is a function of the logic value of a complementary data signal DB. In particular, the delay of the first NAND gate 411 and the delay of the second NAND gate 412 are illustrated as being equal to:

$$\text{DELAY}|_{411} = T0 - \Delta T \times D \tag{1}$$

$$\text{DELAY}|_{412} = T0 - \Delta T \times DB \tag{2}$$

Accordingly, the delay associated with the first NAND gate 411 can be reduced from T0 by an amount equal to $\Delta T$ if the value of the data signal D is a logic 1 value (e.g., "high") and the delay associated with the second NAND gate 412 can be reduced from T0 by an amount equal to $\Delta T$ if the value of the data signal D is a logic 0 value (e.g., "low"). Based on these delay equations, the signal SB at the output of the first NAND gate 411 will commence a falling transition from a logic 1 value to a logic 0 value after an input clock signal CLK transitions from a logic 0 value to a logic 1 value. For example, if the signal RB at the output of the second NAND gate 412 is at a logic 1 value (because the clock signal CLK is initially at a logic 0 value) and the value of the data signal D is a logic 1 value, then the delay between the rising transition of the clock signal CLK to commencement of the falling transition of signal SB will equal $T0-\Delta T$. Similarly, if the signal SB at the output of the first NAND gate 411 is at a logic 1 value and the value of the data signal D is a logic 0 value (i.e., DB=1), then the delay between the rising transition of the clock signal CLK to commencement of the falling transition of signal RB will equal $T0-\Delta T$. Accordingly, the first latch circuit 41 performs a digital-to-time conversion function by varying the time delays of the first and second NAND gates 411 and 412 based on the digital value of the data signal D.

Figure 5:
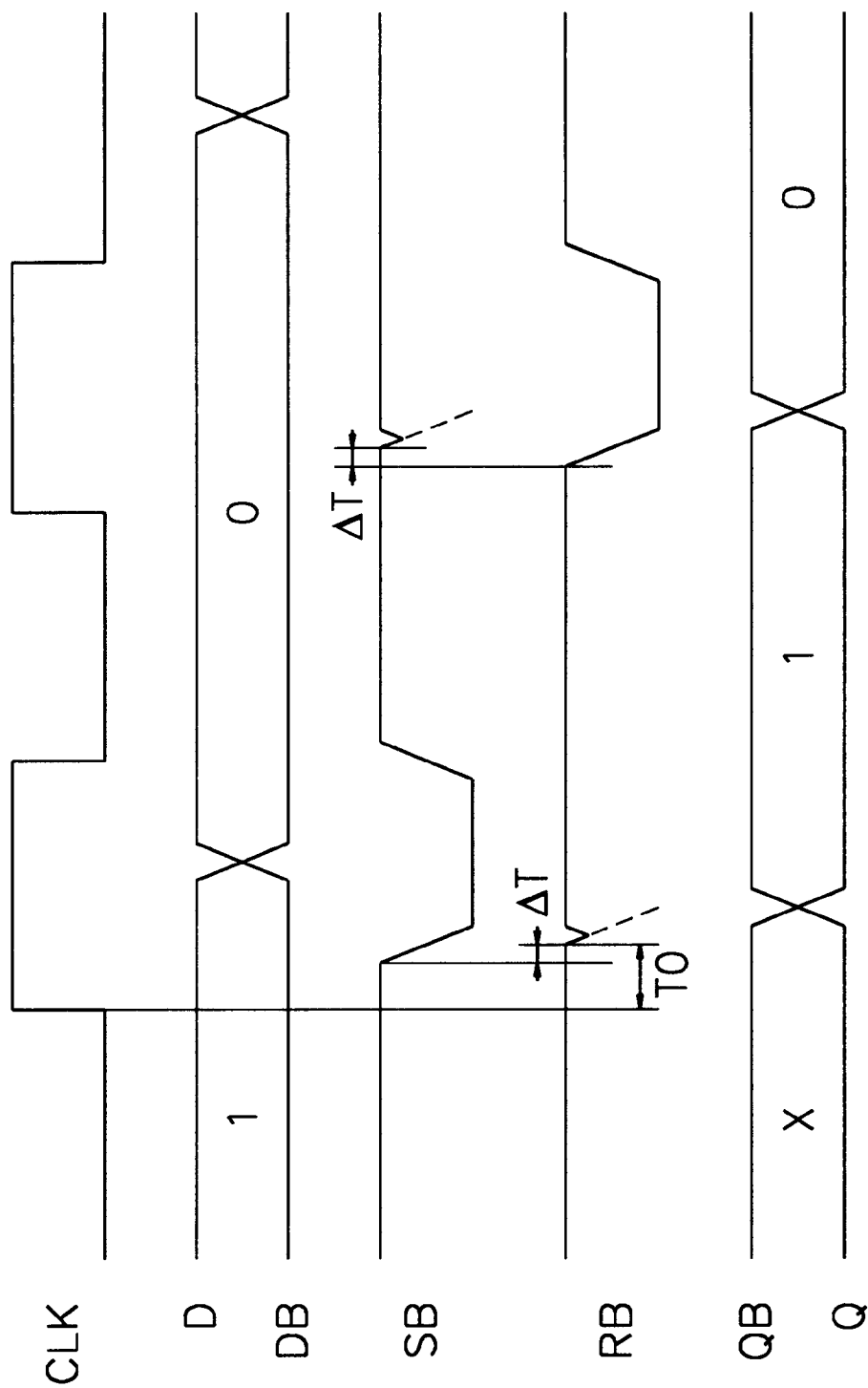
FIG. 5 is a timing diagram that illustrates operation of the flip-flop circuit of FIG. 4.

Operation of the flip-flop circuit of FIG. 4 will now be more fully described with reference to the timing diagram of FIG. 5. In particular, the timing diagram of FIG. 5 illustrates an initial period where the clock signal CLK is initially at a logic 0 value and the outputs of the first and second NAND gates 411 and 412 are both held at logic 1 values (i.e., signals SB and RB are both at logic 1 values). A first leading transition of the clock signal CLK from a logic 0 value to a logic 1 value causes the pair of inputs to the first NAND gate 411 to be at logic 1 values and causes the pair of inputs to the second NAND gate 412 to be at logic 1 values. At the point in time when the clock signal CLK transitions from low-to-high and the data signal D is also at a logic 1 value, the delay associated with the first NAND gate 411 is less than the delay associated with the second NAND gate 412 by an amount equal to $\Delta T$. This delay corresponds to the "pull-down" delay associated with a transition of the output from a logic 1 value to a logic 0 value. In other words, $\text{DELAY}|_{411}=T0-\Delta T$ and $\text{DELAY}|_{412}=T0$. This difference in delay will cause signal SB to commence its falling transition from 1→0 before signal RB commences its falling transition (as shown by the dotted line). Moreover, once SB has fallen sufficiently to a logic 0 value, signal RB at the output of the second NAND gate 412 will cease its falling transition and, instead, will be pulled back up to a full logic 1 value, as illustrated by FIG. 5. As will be understood by those skilled in the art, the transition of signal SB from a logic 1 value to a logic 0 value will cause the output Q of the flip-flop circuit of FIG. 4 to transition to a logic 1 value and cause the complementary output QB to transition to a logic 0 value (since both Q and RB are set at logic 1 values).

Following the rising transition of the output Q of the flip-flop circuit from a logic 0 value to a logic 1 value as shown in FIG. 5, the data signal D is switched to a logic 0 value. This causes the delay associated with the second NAND gate 412 to be less than the delay associated with the first NAND gate 411. Next, the falling transition of the clock signal CLK from a logic 1 value to a logic 0 value will cause the signal SB to transition from a logic 0 value to a logic 1 value. The pull-up delay associated with this rising transition of signal SB is typically independent of the value of the data signal D.

Then, upon the occurrence of a second rising transition of the clock signal CLK, signal RB at the output of the second NAND gate 412 will undergo a falling transition from a logic 1 value to a logic 0 value ahead of the falling transition of signal SB. Accordingly, signal SB will be maintained at a logic 1 value and the complementary output QB of the flip-flop will transition from a logic 0 value to a logic 1 value. Based on this configuration of the flip-flop circuit of FIG. 4, the binary value of the data signal D will influence whether a rising edge of the clock signal results in logic 1 value at the output Q of the flip-flop (with QB=0) or a logic 0 value (with QB=1). Likewise, an evaluation of the value of the output Q after a rising transition of the clock signal CLK can be performed to determine the value of the one bit data signal D. In this manner, the flip-flop circuit of FIG. 4 can be used as a comparator of a pair of one-bit binary signals (that may be generated independently of each other).

Figure 6:
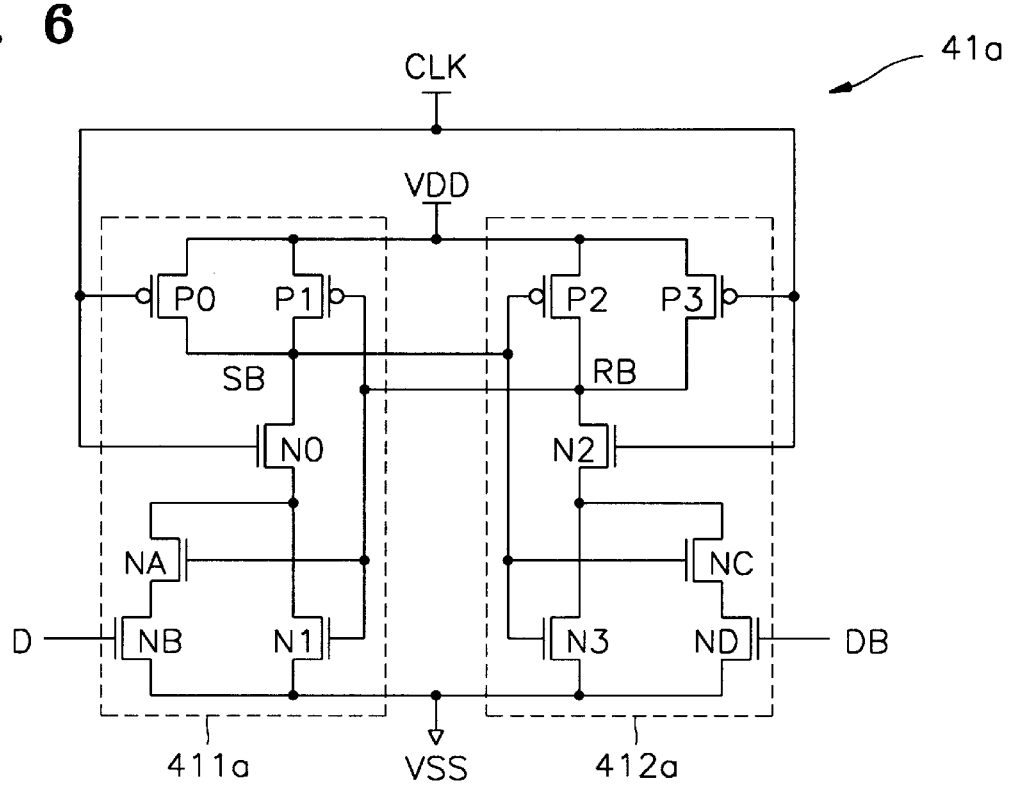
FIGS. 6–12 are electrical schematics of latch circuits that may be used in the flip-flop circuit of FIG. 4.

Referring now to FIGS. 6–12, preferred embodiments of the first latch circuit 41 of FIG. 4 will be described. In particular, FIG. 6 illustrates a latch circuit 41a that generates signals SB and RB in response to a clock signal CLK and a pair of complementary data signals D and DB. The latch circuit 41a includes a first NAND gate 411a and a second NAND gate 412a. PMOS transistors P0 and P1 and NMOS transistors N0–N1 and NA and NB within the latch circuit 41a collectively perform the functions of the first NAND gate 411 of FIG. 4, with PMOS transistors P0–P1 and NMOS transistors N0–N1 collectively forming a conventional two-input NAND gate. PMOS transistors P2 and P3 and NMOS transistors N2–N3 and NC and ND within the latch circuit 41a collectively perform the functions of the second NAND gate 412 of FIG. 4.

As illustrated by the latch circuit 41a of FIG. 6, the NMOS transistors NA and NB are connected in series with each other and in parallel with the NMOS pull-down transistor N1, which is located at the bottom of the pull-down path formed by the serial (i.e., source-to-drain) combination of NMOS transistor N0 and N1. The pul-down path extends from the output SB to the reference potential Vss. Accordingly, when both NMOS transistors NA and NB are turned-on in combination with NMOS pull-down transistor N1, the effective on-state impedance between the source of NMOS pull-down transistor N0 and the ground reference potential VSS is reduced. Stated alternatively, the effective width of the NMOS pull-down transistor N1 is increased to a level $W1_{effective}$ when both NMOS transistors NA and NB having widths WA and WB are turned on (RB=1 and D=1), where:

$$W1_{effective}=W1+(WA \times WB)/(WA+WB) \quad (3)$$

Accordingly, the data signal D, which drives the gate electrode of NMOS transistor NB in the latch circuit 41a of FIG. 6, can be controlled to reduce the resistance of the pull-down path between node SB and VSS within the first NAND gate 411a. In particular, setting the data signal D to a logic 1 value (while signal RB is at a logic 1 value) will enable the first NAND gate 411a to pull-down the output signal SB at a faster rate relative to a conventional NAND gate comprising only PMOS pull-up transistors P0–P1 and NMOS pull-down transistors N0–N1.

Likewise, as illustrated by the second NAND gate 412a of FIG. 6, the NMOS transistors NC and ND are connected in series with each other and in parallel with the NMOS pull-down transistor N3. Accordingly, when both NMOS transistors NC and ND are turned-on in combination with NMOS pull-down transistor N3, the effective on-state impedance between the source of NMOS pull-down transistor N2 and the ground reference potential VSS is reduced. Stated alternatively, the effective width of the NMOS pull-down transistor N3 is increased to a level $W3_{effective}$ when both NMOS transistors NC and ND having widths WC and WD are turned on (SB=1 and DB=1), where:

$$W3_{effective}=W3+(WC \times WD)/(WC+WD) \quad (4)$$

Based on this configuration of the second NAND gate 412a, the complementary data signal DB, which drives the gate electrode of NMOS transistor ND in the latch circuit 41a of FIG. 6, can be controlled to reduce the resistance of the pull-down path between the output node RB and VSS within the second NAND gate 412a. In particular, setting the complementary data signal DB to a logic 1 value (while signal SB is at a logic 1 value) will enable the second NAND gate 412a to pull-down the output signal RB at a faster rate relative to a conventional NAND gate comprising only PMOS pull-up transistors P2–P3 and NMOS pull-down transistors N2–N3. Thus, the data signal D and the complementary data signal DB can be controlled to render the first NAND gate 411a faster (in pull-down) than the second NAND gate 412a or vice versa.

Accordingly, the integrated circuit latch of FIGS. 4 and 6 includes a pair of logic gates (e.g., NAND gates 411 and 412) that each have first and second data inputs and an output, with the first inputs electrically connected together and responsive to a latching signal (e.g,, CLK) and with each of the second inputs electrically connected to an output of the other logic gate in the pair. The pair of logic gates comprises a first logic gate (e.g., NAND gate 411a in FIG. 6) having circuitry therein (e.g., NMOS transistors NA and NB) that, in response to a first control signal (e.g, D), adjusts a pull-down delay characteristic of the first logic gate by reducing an effective on-state impedance of a MOS transistor (e.g, NMOS transistor N1) within an active pull-down path when an output (e.g., SB) of the first logic gate is being pulled from a logic 1 value to a logic 0 value by the active pull-down path defined by the serial combination of NMOS transistors N0 and N1.

Figure 7:
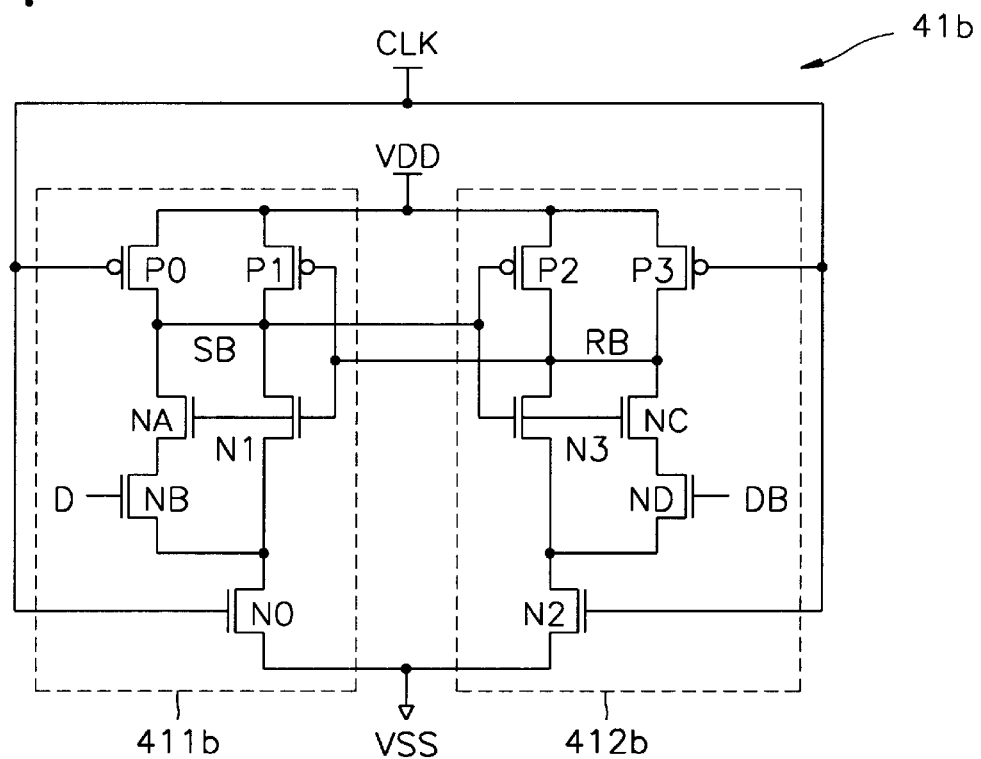

The first latch circuit 41b of FIG. 7 is similar to the first latch circuit 41a of FIG. 6, however, the series connection of NMOS pull-down transistors N0 and N1 within the first NAND gate 411b has been reversed and the series connection of NMOS pull-down transistors N2 and N3 within the second NAND gate 412b has been reversed. Notwithstanding this change, the series pair of NMOS transistors NA and NB is still connected in parallel with the NMOS pull-down transistor N1 and the series pair of NMOS transistors NC and ND is still connected in parallel with the NMOS pull-down transistor N3. Otherwise, the operation of the first latch circuit 41b of FIG. 7 is the same as the operation of the first latch circuit 41a of FIG. 6.

Figure 8:
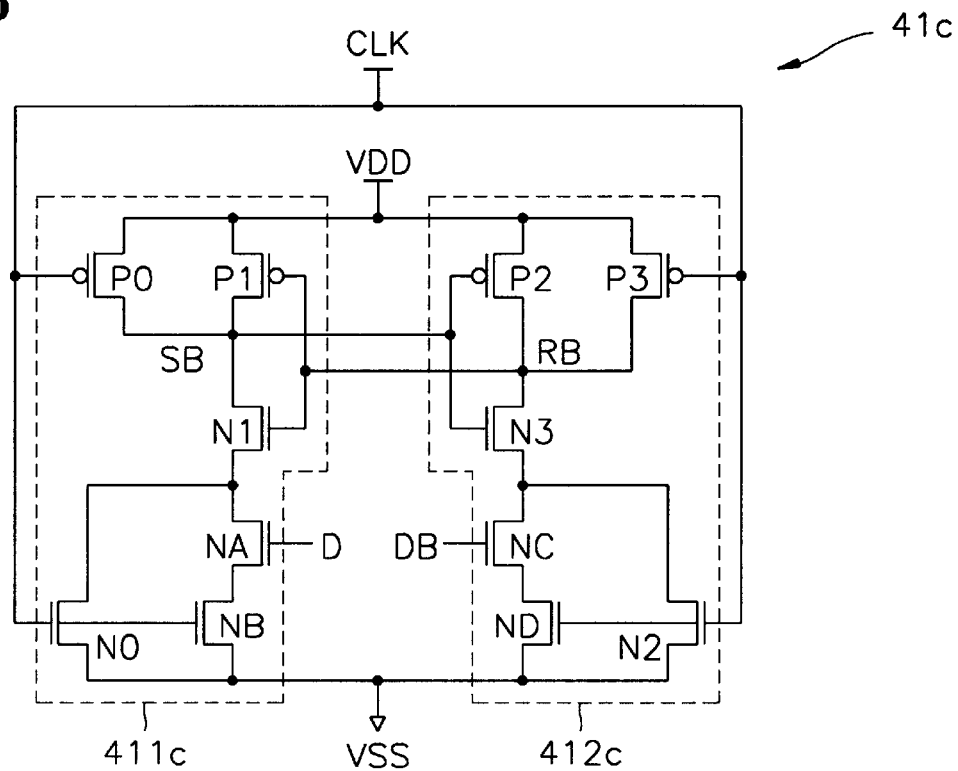
Figure 9:
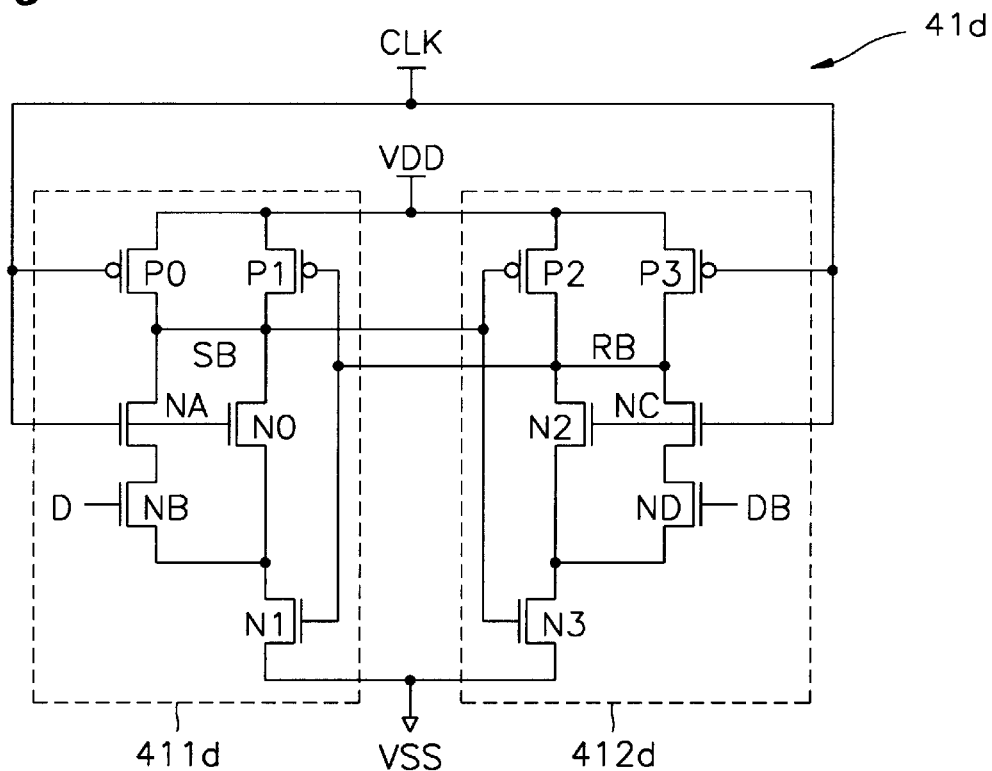

The first latch circuit 41c of FIG. 8 is similar to the first latch circuit 41b of FIG. 7, however, the series pair of NMOS transistors NA and NB is connected in parallel with the NMOS transistor N0 and the series pair of NMOS transistors NC and ND is connected in parallel with the NMOS transistor N2. Moreover, NMOS transistors NA and NC are responsive to the data signal D and complementary data signal DB, as illustrated. Like NMOS transistors N0 and N2, which are responsive to the clock signal CLK, NMOS transistors NB and ND are responsive to the clock signal CLK. Thus, neither NMOS transistor NA nor NB in the first NAND gate 411c is responsive to signal RB and neither NMOS transistor NC nor ND in the second NAND gate 412c is responsive to signal SB, as in the circuits 41a and 41b of FIGS. 6 and 7. The first latch circuit 41d of FIG. 9 is similar to the latch circuit 41c of FIG. 8, however, the vertical totem-pole placement of NMOS transistors N0 and N1 within the pull-down path of the first NAND gate 411d has been reversed and the vertical placement of NMOS transistors N2 and N3 within the pull-down path of the second NAND gate 412d has also been reversed.

Figure 10:
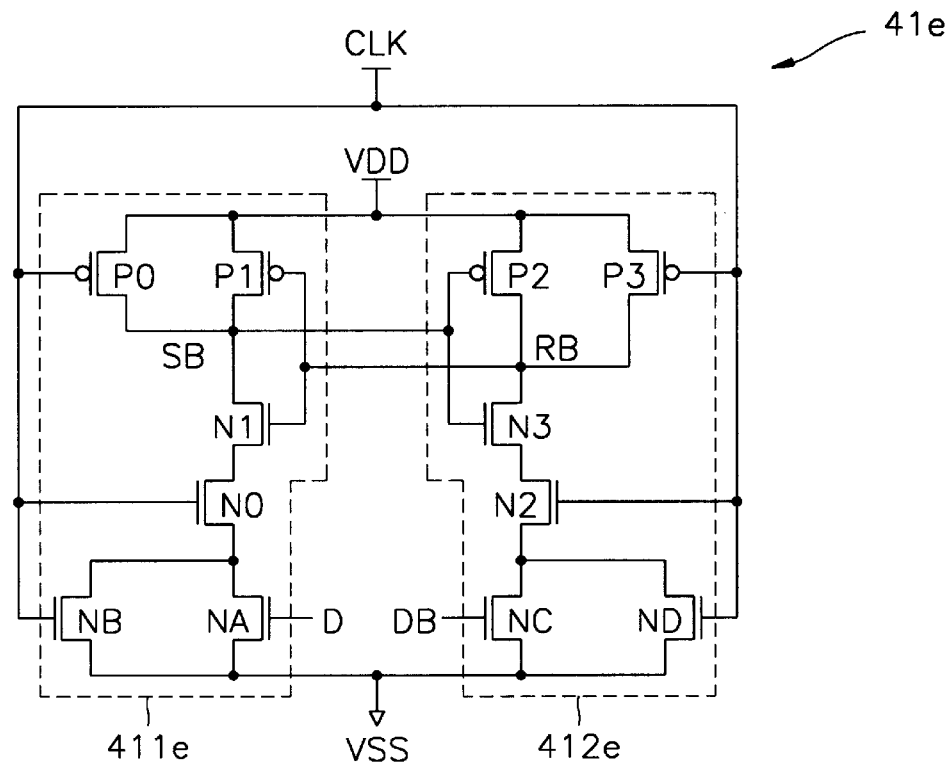

Referring now to FIG. 10, an alternative first latch circuit 41e is illustrated. This first latch circuit 41e includes a first NAND gate 411e and a second NAND gate 412e. The pull-down path within the first NAND gate 411e includes a vertical totem-pole arrangement of three NMOS transistors N1, N0 and NB, with NMOS transistor NA connected in parallel with NMOS transistor NB. The NMOS transistor NA is responsive to the data signal D. Thus, the length of the pull-down path in the first NAND gate 411e is longer than the length of the pull-down paths in the first NAND gates of FIGS. 6–9. Accordingly, the first NAND gate 411e within the first latch circuit 41e of FIG. 10 may not have as fast a pull-down performance as the first NAND gates within the first latch circuits of FIGS. 6–9. The pull-down path within the second NAND gate 412e also includes a vertical totem-pole arrangement of three NMOS transistors N3, N2 and ND, with NMOS transistor NC connected in parallel with NMOS transistor ND. The NMOS transistor NC is responsive to the complementary data signal DB.

Figure 11:
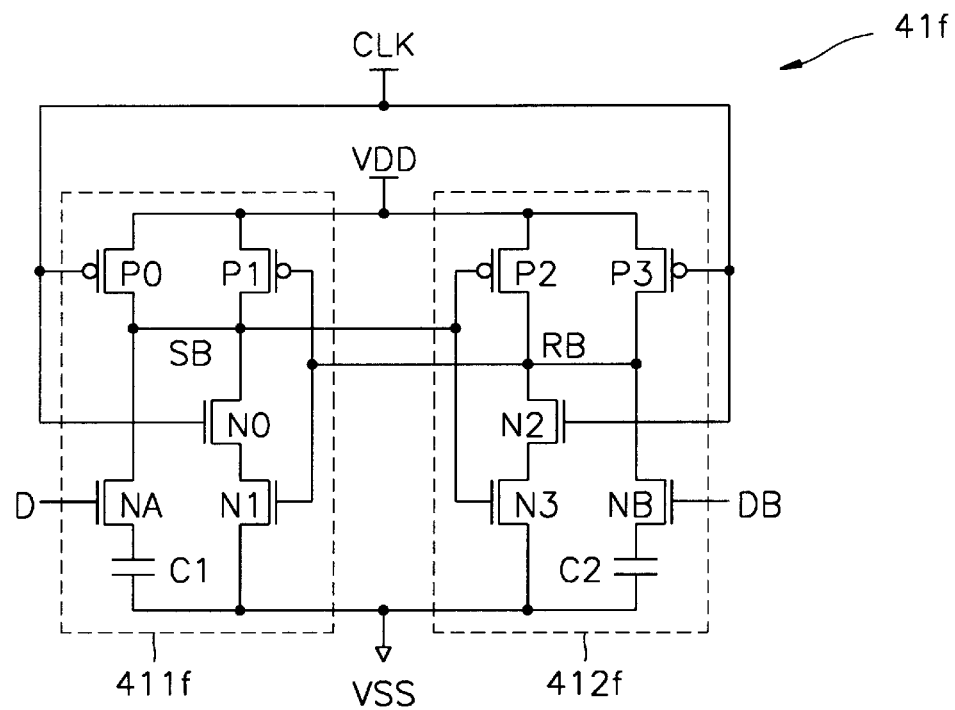

In FIG. 11, a first latch circuit 41f is illustrated that includes a first NAND gate 411f and a second NAND gate 412f. The series totem-pole pull-down path provided by NMOS transistors N0 and N1 within the first NAND gate 411f is conventional. The pull-down speed of the first NAND gate 411f can be varied by the parallel path provided by NMOS transistor NA, which is responsive to the data signal D, and a capacitor C1. The series totem-pole pull-down path provided by NMOS transistors N2 and N3 within the second NAND gate 412f is conventional. The pull-down speed of the second NAND gate 412f can be varied by the parallel path provided by NMOS transistor NB, which is responsive to the complementary data signal DB, and a capacitor C2. Accordingly, setting the data signal D to a logic 1 value and the complementary data signal DB to a logic 0 value will cause the first NAND gate 411f to have a higher pull-down speed relative to the second NAND gate 412f and vice versa when the data signal D is set to a logic 0 value and the complementary data signal DB is set to a logic 1 value.

Figure 12:
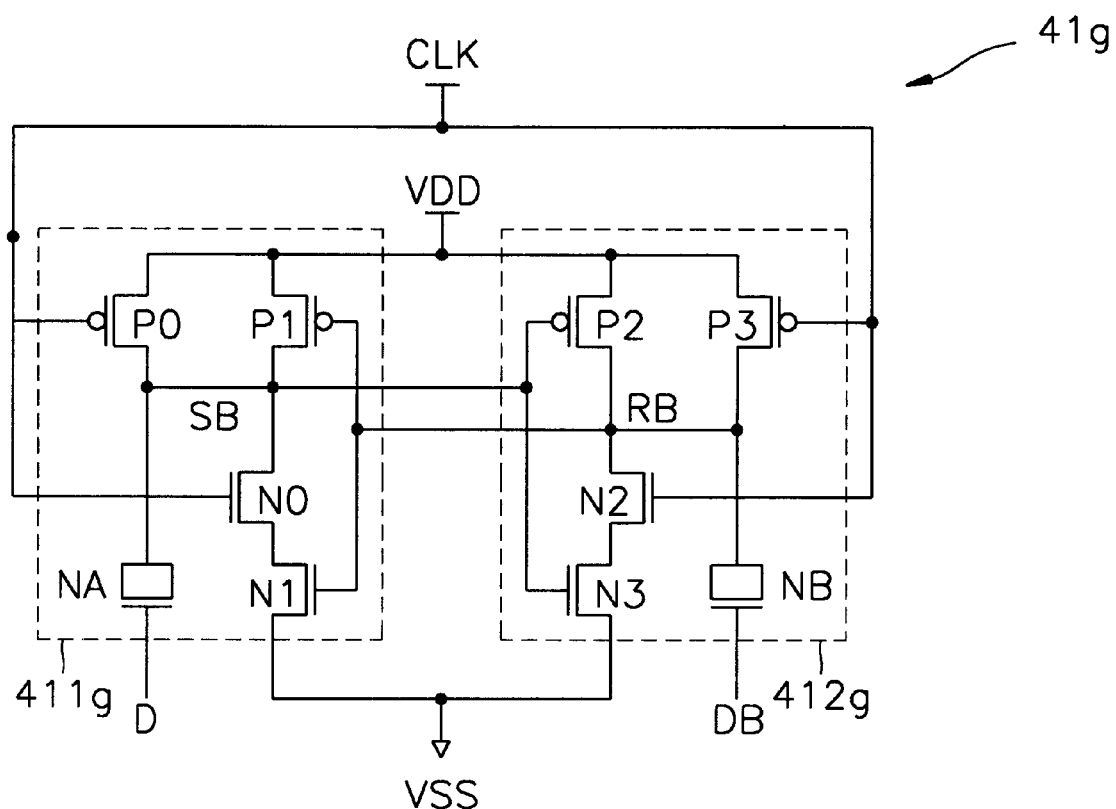

In FIG. 12, the first latch circuit 41g includes a first NAND gate 411g and a second NAND gate 412g of generally conventional designs. However, a first MOS capacitor, comprising an NMOS transistor NA having its drain and source regions connected together, is tied to the output signal line SB and has a gate electrode responsive to the data signal D. A second MOS capacitor, comprising an NMOS transistor NB having its drain and source regions connected together, is tied to the output signal line RB and has a gate electrode responsive to the complementary data signal DB. Setting the data signal D to a logic 1 value and the complementary data signal DB to a logic 0 value will cause the MOS capacitor formed by NMOS transistor NB to support the output signal line RB at a logic 1 value to a greater extent relative to the support provided to output signal line SB by the MOS capacitor formed by NMOS transistor NA. In contrast, setting the data signal D to a logic 0 value and the complementary data signal DB to a logic 1 value will cause the MOS capacitor formed by NMOS transistor NA to support the output signal line SB at a logic 1 value to a greater extent relative to the MOS capacitor formed by NMOS transistor NB. Accordingly, the first NAND gate 411g will have a faster pull-down speed relative to the second NAND gate 412g when the data signal D is set to a logic 1 value and vice versa when the data signal D is set to a logic 0 value. In this manner, as with all the first latch circuits of FIGS. 4 and 6–12, the digital values of D and DB can be converted into a pull-down delay difference between the first and second NAND gates that can be detected by evaluating the values of Q and QB generated by the second latch circuit 43 of FIG. 4.

According to additional aspects of these embodiments illustrated by FIGS. 4 and 6–12, the complementary data signal DB may be replaced by a reference voltage (Vref). Alternatively, the power supply potential of Vdd may be applied to the second NAND gate 412 in place of the complementary data signal DB. For example, with respect to the first latch circuit 41a of FIG. 6, the width of NMOS transistor ND within the second NAND gate 412a can be made smaller than the width of the NMOS transistor NB within the first NAND gate 41Ia. This disparity in width will cause the first NAND gate 411a to have a faster-pull-down performance relative to the second NAND gate 412a when the data signal D is at a logic 1 value and a slower pull-down performance when the data signal D is at a logic 0 value. The size of the NMOS transistors can also be adjusted to minimize ΔT so that any change in set-up time caused by different values of the data signal D can be minimized. Moreover, because the clock signal CLK and data signal D (and complementary data signal DB) are provided to gate electrodes of NMOS transistors within the first and second NAND gates, the respective delay times of the clock signal CLK and data signal D with respect to changes in fabrication process, power supply voltage and temperature can be more equally tracked. Accordingly, differences in setup time that might normally occur in response to changes in fabrication process, temperature and supply voltage can be minimized and the width of the set-up/hold window can be made narrow. High integration on an integrated circuit substrate can also be achieved.

Figure 13:
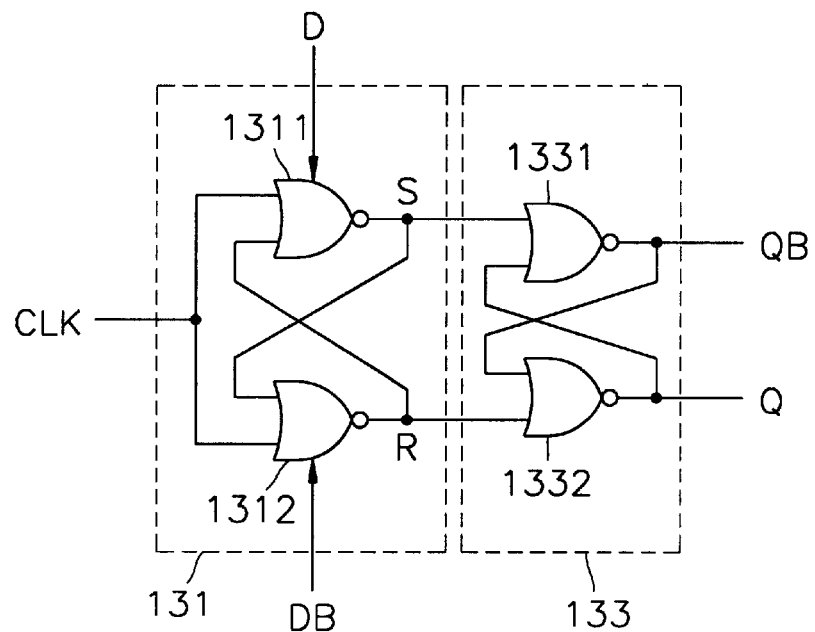
FIG. 13 is an electrical schematic of a flip-flop circuit according to a second embodiment of the present invention.

Referring now to FIG. 13, a flip-flop circuit according to a second embodiment of the present invention includes a first latch circuit 131 and a second latch circuit 133. The first latch circuit 131 includes a first NOR gate 1311 and a second NOR gate 1312, connected as illustrated. Both the first and second NOR gates 1311 and 1312 are responsive to a clock signal CLK. The first NOR gate 1311 is also responsive to a data signal D and the second NOR gate 1312 is responsive to a complementary data signal DB. The second latch circuit 133 is connected to the outputs S and R from the first latch circuit 131 and comprises a third NOR gate 1311 and a fourth NOR gate 1332, connected as illustrated. As will be understood by those skilled in the art, the flip-flop circuit of FIG. 13 is a dual of the flip-flop circuit of FIG. 4 and each of the NOR gates within the first latch circuit 131 may be realized by having two serially connected PMOS transistors extending between Vdd and an output and two parallel connected NMOS transistors extending between the output and the ground reference potential Vss. To obtain a variable delay, the first NOR gate 1311 may include a pair of serially connected PMOS transistors that extend parallel with one of the PMOS transistors in the pull-up path between the output and Vdd. Accordingly, the value of the data signal D may be used to control the relative rates at which the outputs S and R transition from a logic 0 value to a logic 1 value. Duals of the latch circuits of FIGS. 6–12 may be used in the flip-flop circuit of FIG. 13.

Figure 14:
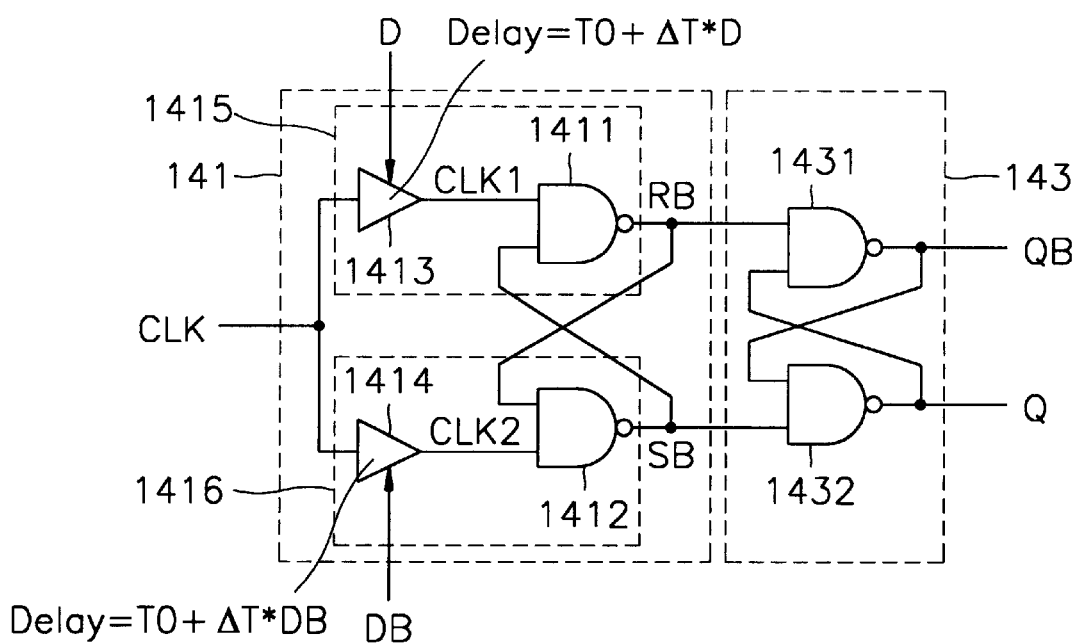
FIG. 14 is an electrical schematic of a flip-flop circuit according to a third embodiment of the present invention.
Figure 15:
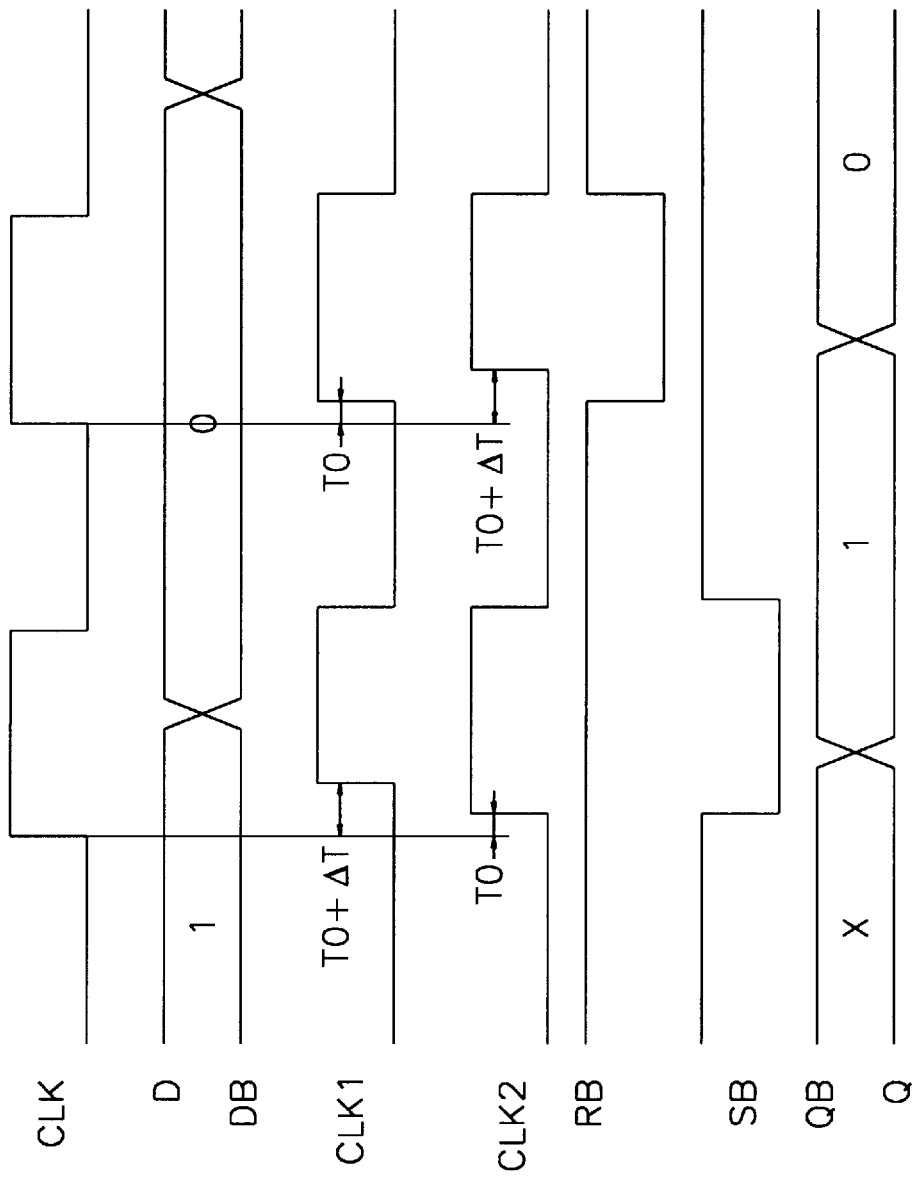
FIG. 15 is a timing diagram that illustrates operation of the flip-flop circuit of FIG. 14.

Referring now to FIGS. 14–15, a flip-flop circuit according to a third embodiment of the present invention is illustrated. This flip-flop circuit comprises a first latch circuit 141 and a second latch circuit 143. The first latch circuit 141 includes first and second delay stages 1413 and 1414, respectively, and first and second NAND gates 1411 and 1412, respectively. The first delay stage 1413 and the first NAND gate 1411 collectively form a first logic gate 1415 having two data inputs, a control input (shown as responsive to a data signal D) and an output. The second delay stage 1414 and the second NAND gate 1412 collectively form a second logic gate 1416 having two data inputs, a control input (shown as responsive to a complementary data signal DB) and an output.

The second latch circuit 143, which is identical to the second latch circuit 43 of FIG. 4, includes third and fourth NAND gates 1413 and 1432, connected as illustrated. According to a preferred aspect of this third embodiment, the first delay stage 1413 has a variable delay characteristic that is a function of the value of the data signal. Similarly, the second delay stage 1414 has a variable delay characteristic that is a function of the value of the complementary data signal DB. As illustrated by FIG. 14, these delay characteristics may be defined by the following expressions:

$$\text{DELAY}|_{1413} = T0 + \Delta T \times D \quad (5)$$

$$\text{DELAY}|_{1414} = T0 + \Delta T \times DB \quad (6)$$

Figure 16:
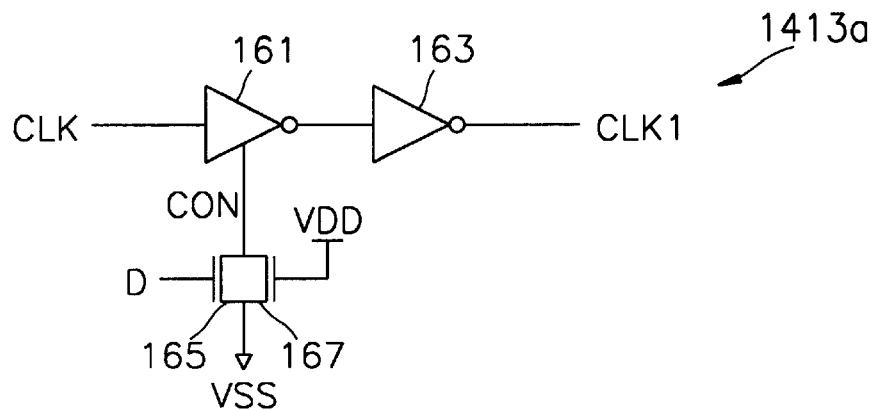
FIGS. 16–19 are electrical schematics of delay stages that may be used in the flip-flop circuit of FIG. 14.
Figure 19:
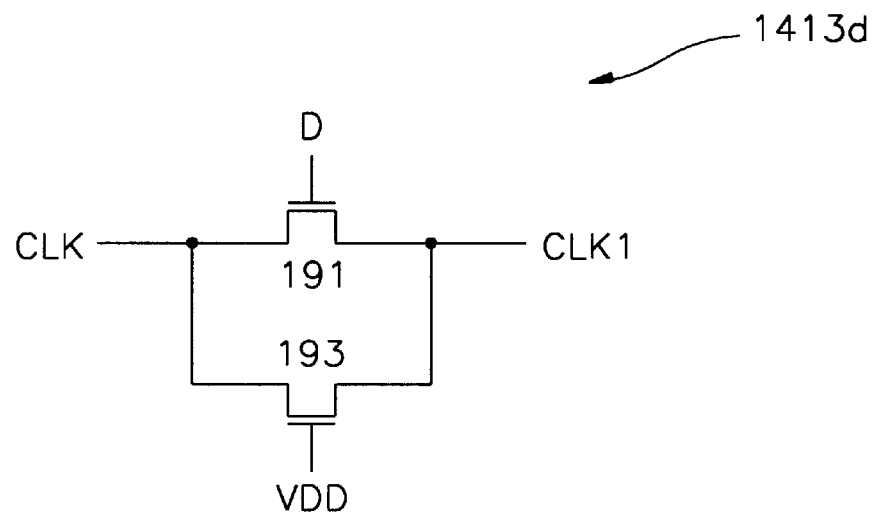

Alternative expressions can be defined for those cases where the delay decreases when the data signal D is switched low-to-high (see, e.g., FIGS. 16 and 19). As illustrated by FIG. 14, the first delay stage 1413 generates a first clock signal CLK1 in response to the clock signal CLK and the second delay stage 1414 generates a second clock signal CLK2 in response to the clock signal CLK. As illustrated by the timing diagram of FIG. 15, which illustrates operation of the flip-flop circuit of FIG. 14, the timing of the rising edges of the first and second clock signals CLK1 and CLK2 (relative to a rising edge of the clock signal CLK) can be controlled based on the data signal D and complementary data signal DB. Because the clock signal CLK and data signal D (and complementary data signal DB) are provided to gate electrodes of MOS transistors within the first and second inverters, the respective delay times of the clock signal CLK and data signal D with respect to changes in fabrication process, power supply voltage and temperature can be more equally tracked. Accordingly, differences in set-up time that might normally occur in response to changes in fabrication process, temperature and supply voltage can be minimized and the width of the set-up/hold window can be made narrow.

Detailed electrical schematics of exemplary first delay stages 1413 are illustrated by FIGS. 16–19. In particular, FIG. 16 illustrates a first delay stage 1413a that comprises a pair of serially-connected inverters 161 and 163. A pair of NMOS transistors 165 and 167 are also provided in the pull-down path of the inverter 161 (labeled as CON), as illustrated. NMOS transistor 167 is always turned on (in response to the signal Vdd at its gate electrode) and NMOS transistor 165 is turned on or off in response to the data signal D. In this manner, the resistance of the pull-down path provided by the NMOS transistors 165 and 167 can be adjusted as a function of the data signal D and this variable resistance causes the inverter 161 to have a variable delay characteristic. The delay of the first delay stage 1413a is illustrated as decreasing when the data signal D is switched from low-to-high.

Figure 17:
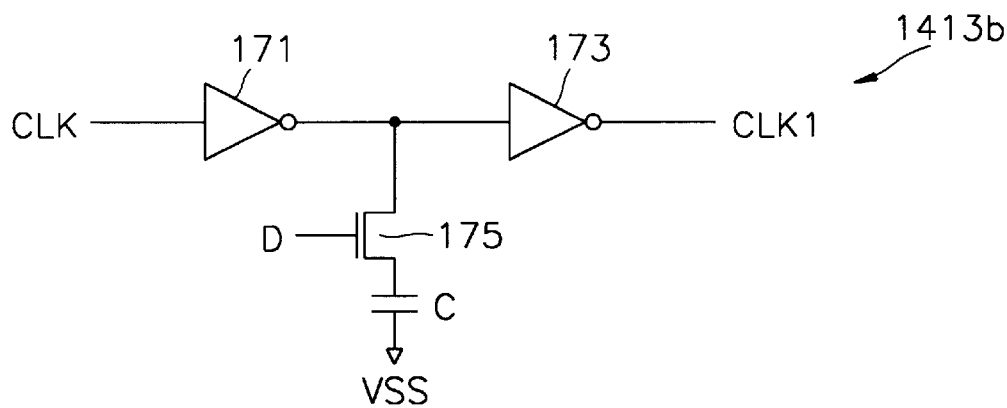
Figure 18:
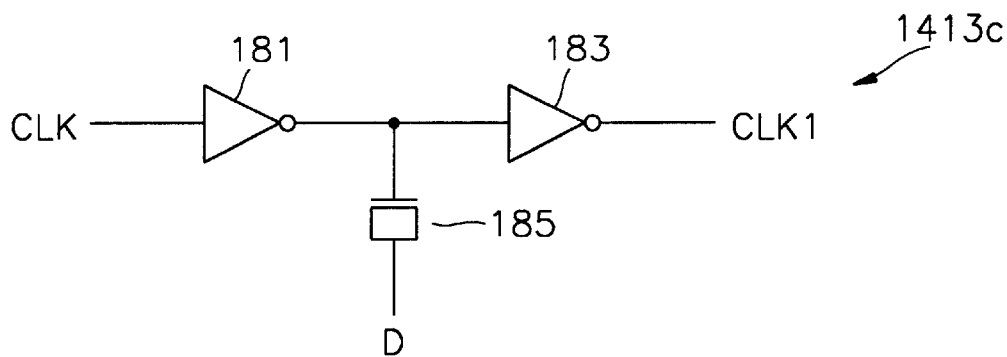

The second exemplary delay stage 1413b of FIG. 17 includes a pair of serially connected inverters 171 and 173 and a load circuit connected a between the output of the inverter 171 and the input of inverter 173. The load circuit comprises an NMOS transistor 175 and a capacitor C, which collectively form an RC delay circuit when the data signal D is set to a logic 1 value. The third exemplary delay stage 1413c of FIG. 18 includes a pair of serially connected inverters 181 and 183 and a load circuit connected between the output of the inverter 181 and the input of inverter 183. The load circuit comprises an NMOS transistor 185 that is configured as a MOS capacitor, with one terminal of the MOS capacitor (i.e., the gate electrode of the NMOS transistor) being responsive to the data signal D. Accordingly, the logic value of the data signal D can be used to control capacitive loading within the delay stage 1413c. The fourth exemplary delay stage 1413d of FIG. 19 includes normally-on NMOS transistor 193 in parallel with an NMOS transistor 191 that can be turned on in response to the data signal D. In particular, the RC loading between the input (at which the clock signal CLK is received) and the output (at which the first clock signal CLK1 is generated) can be varied by varying the resistance between the input and output in response to changes in the data signal D. Like the first delay stage 1413a, the delay of the first delay stage can be decreased when the data signal D is switched from low to high.

Figure 20:
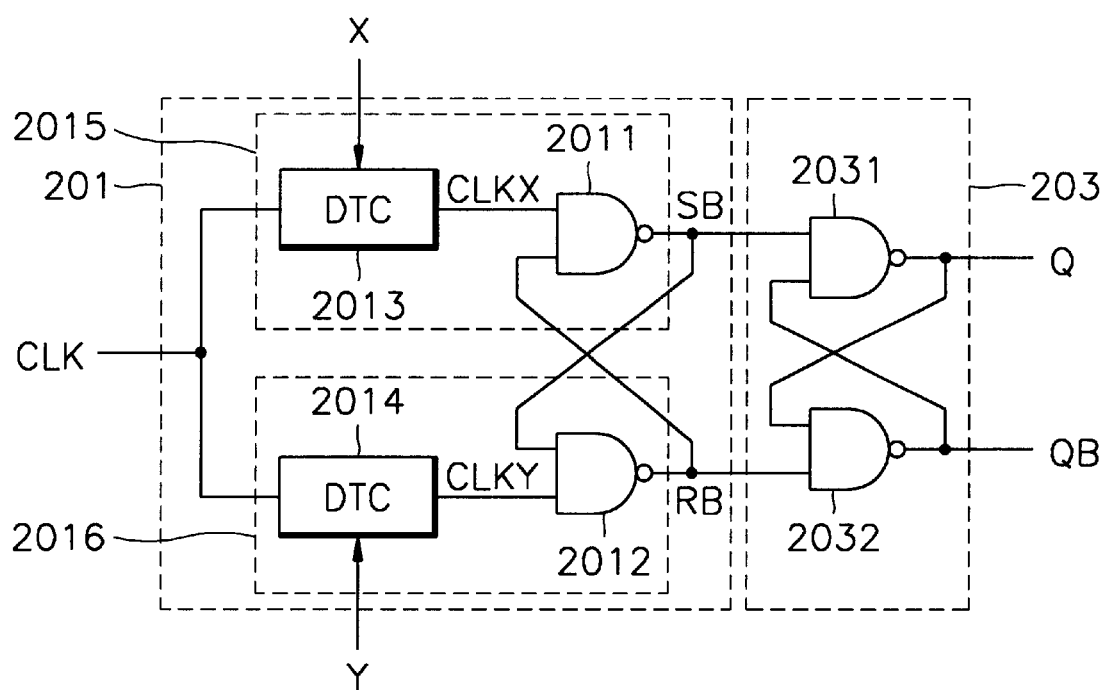
FIG. 20 is an electrical schematic of a flip-flop circuit according to a fourth embodiment of the present invention that may be used as a digital comparator circuit.

Referring now to FIG. 20, a flip-flop circuit according to a fourth embodiment of the present invention will now be described. This embodiment is similar to the embodiment of FIG. 14, however, the first and second delay stages (i.e., one-bit delay stage) of FIG. 14 are replaced by a first multi-bit delay stage 2013 and a second multi-bit delay stage 2014. Thus, the first latch circuit 201 includes a first NAND gate 2011 and a second NAND gate 2012, connected as illustrated, along with the first multi-bit delay stage 2013 and the second multi-bit delay stage 2014. The first multi-bit delay stage 2013 and the first NAND gate 2011 collectively form a first logic gate 2015 having two data inputs, a control input (shown as responsive to multi-bit signal X) and an output. The second delay stage 2014 and the second NAND gate 2012 collectively form a second logic gate 2016 having two data inputs, a control input (shown as responsive to multi-bit signal Y) and an output.

The first multi-bit delay stage 2013 generates a first clock signal CLKX in response to the clock signal CLK and a first multi-bit data signal X and the second multi-bit delay stage 2014 generates a second clock signal CLKY in response to the clock signal CLK and a second multi-bit data signal Y. The flip-flop circuit of FIG. 20 also comprises a second latch circuit 203 comprising a third NAND gate 2013 and a fourth NAND gate 2032 connected as illustrated.

Figure 21:
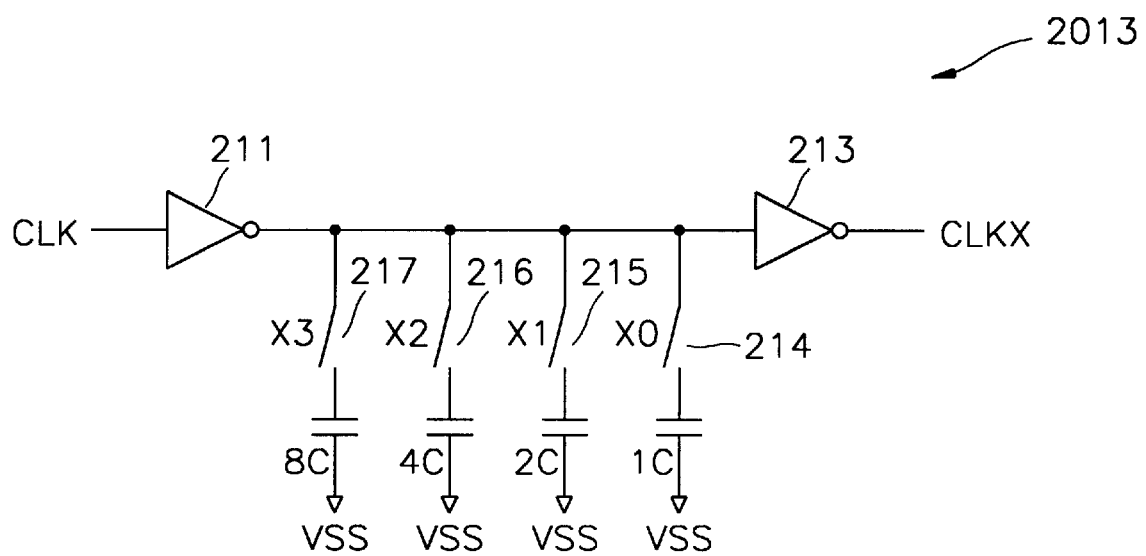
FIG. 21 is an electrical schematic of a multi-bit delay stage that may be used in the flip-flop circuit of FIG. 20.

In FIG. 21, an electrical schematic of a first multi-bit delay stage 2013 is provided. The second multi-bit delay stage 2013 may have similar design. As illustrated, a pair of inverters 211 and 213 are provided in series, with a variable capacitive load therebetween. The multi-bit data signal X may be an N-bit word (where N is an integer), with each bit of the N-bit word determining the on-state or off-state of a respective switch in the group of switches 214–217. Here, the N-bit word may be a four bit word {X0,X1,X2,X3, where X3 is the most significant bit}. The group of switches 214–217 are connected to a plurality of capacitors having capacitance values that are scaled from a minimum value of 1C to a maximum value of 8C ($2^{N-1}$C). The flip-flop circuit of FIGS. 20–21 may be utilized as a comparator circuit, whereby in response to a clock signal CLK, the value of the output signal Q (relative to QB) can be evaluated to determine whether the multi-bit data signal X is less than or greater than the multi-bit data signal Y.

Figure 22:
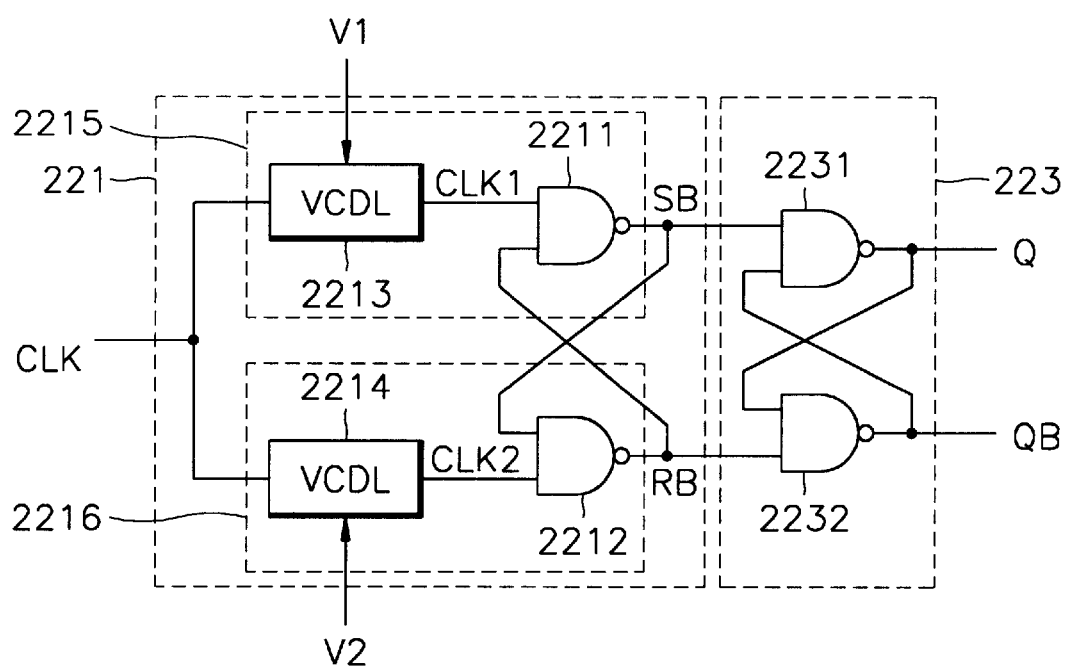
FIG. 22 is an electrical schematic of a flip-flop circuit according to a fifth embodiment of the present invention that may be used as an analog comparator circuit.
Figure 23A:
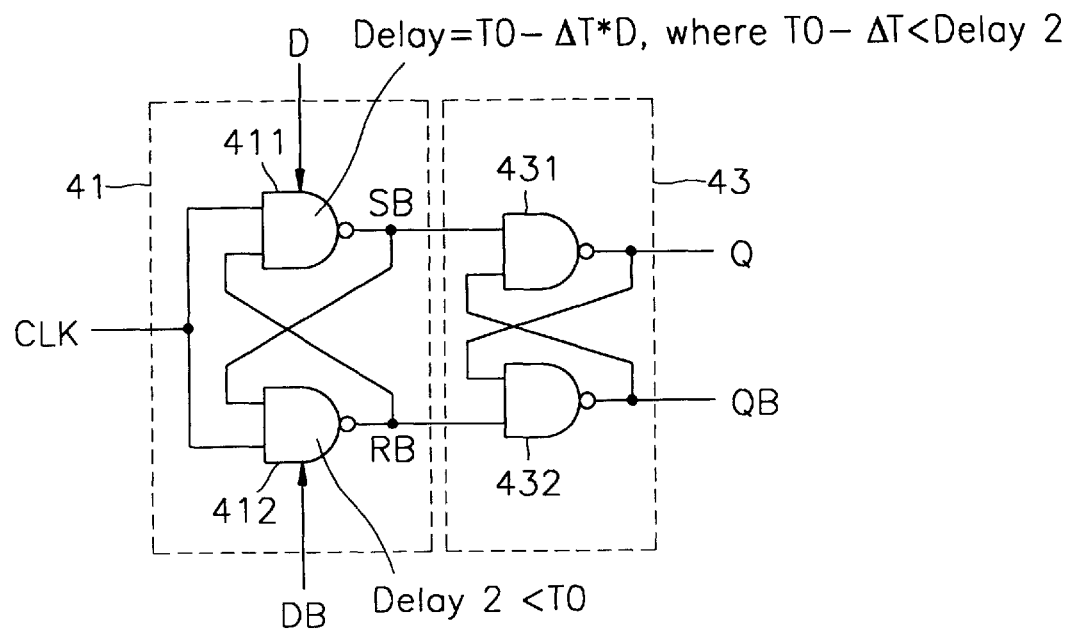
FIG. 23A is an electrical schematic of a flip-flop circuit according to a sixth embodiment of the present invention.
Figure 23B:
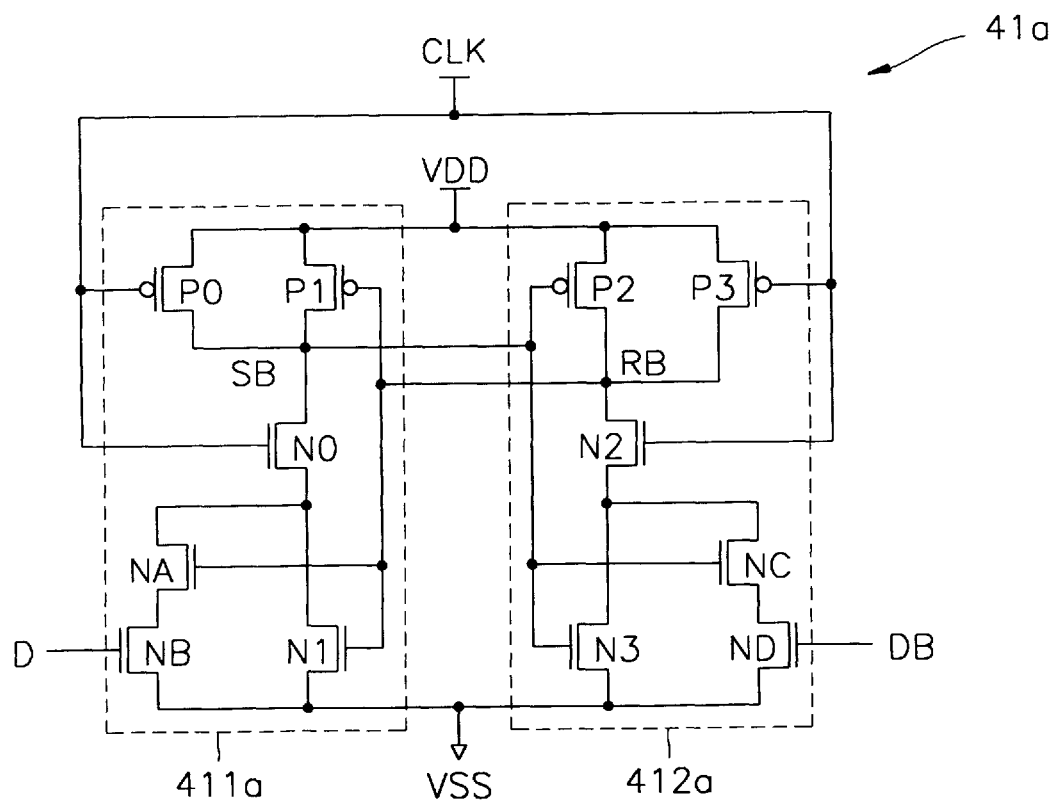
FIG. 23B is an electrical schematic of a latch circuit that may be used in the flip-flop circuit of FIG. 23A.

Referring now to FIG. 22, a flip-flop circuit according to a fifth embodiment of the present invention is similar to the flip-flop circuit of FIG. 20, however, the first delay stage 2213 and the second delay stage 2214 comprise voltage controlled delay lines (VCDL) (or voltage-to-time converters (not shown)). As illustrated, these VCDLs, which may be of conventional design, are responsive to respective analog signals V1 and V2. According, the first latch circuit 221 and the second latch circuit 223 may be used as an analog voltage comparator, whereby the value of Q relative to QB can be monitored to determine whether V1>V2 or V2<V1. As illustrated, the first latch circuit 221 includes first and second NAND gates 2211 and 2212 and the second latch circuit 223 includes third and fourth NAND gates 2231 and 2232. These comparators of FIGS. 20–22 can be designed to consume relatively small amounts of area on an integrated circuit substrate and to have high operation speed.

The first delay stage 2213 and the first NAND gate 2211 collectively form a first logic gate 2215 having two data inputs, a control input (shown as responsive to signal V1) and an output. The second delay stage 2214 and the second NAND gate 2212 collectively form a second logic gate 2216 having two data inputs, a control input (shown as responsive to signal Y) and an output.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit latch, comprising:
a pair of logic gates that each have first and second data inputs and an output, with the first inputs electrically connected together and responsive to a latching signal and with each of the second inputs electrically connected to an output of the other logic gate in said pair, said pair of logic gates comprising:
a first logic gate having first circuitry therein that, in response to a first control signal, adjusts a pull-down delay characteristic of the first logic gate by reducing an effective on-state impedance of a first pull-down path therein when an output of said first logic gate is being pulled from a logic 1 value to a logic 0 value by the first pull-down path.

2. The latch of claim 1, wherein said pair of logic gates further comprises:
a second logic gate having second circuitry therein that, in response to a second control signal, adjusts a pull-down delay characteristic of the second logic gate by reducing an effective on-state impedance of a second pull-down path therein when an output of said second logic gate is being pulled from a logic 1 value to a logic 0 value by the second pull-down path.

3. The latch of claim 1, wherein the first circuitry within the first logic gate adjusts a pull-down delay characteristic of the first logic gate by reducing an effective on-state impedance of a first MOS transistor within the first pull-down path.

4. The latch of claim 2, wherein the first and second control signals are complementary data signals.

5. The latch of claim 1, wherein the latching signal is a clock signal.

6. An integrated circuit latch, comprising:
a pair of logic gates that each have first and second data inputs and an output, with the first inputs electrically connected together and responsive to a latching signal and with each of the second inputs electrically connected to an output of the other logic gate in said pair, said pair of logic gates comprising:
a first logic gate having first circuitry therein that, in response to a first control signal, adjusts a pull-down delay characteristic of the first logic gate by reducing an effective on-state impedance of a first pull-down path therein when an output of said first logic gate is being pulled from a logic 1 value to a logic 0 value by the first pull-down path;
wherein the first logic gate comprises a first pair of MOS transistors connected source-to-drain in a first totem-pole arrangement;
wherein the first circuitry comprises a second pair of MOS transistors connected source-to-drain in a second totem-pole arrangement; and
wherein the second totem-pole arrangement is connected in parallel with one of the MOS transistors in the first totem-pole arrangement.

7. The latch of claim 6, wherein a MOS transistor in the second totem-pole arrangement is responsive to the first control signal.

8. An integrated circuit latch, comprising:
a pair of logic gates that each have first and second data inputs and an output, with the first inputs electrically connected together and responsive to a latching signal and with each of the second inputs electrically connected to an output of the other logic gate in said pair, said pair of logic gates comprising:
a first logic gate having first circuitry therein that, in response to a first control signal, adjusts a pull-down delay characteristic of the first logic gate by reducing an effective on-state impedance of a first pull-down path therein when an output of said first logic gate is being pulled from a logic 1 value to a logic 0 value by the first pull-down path; and
a second logic gate having second circuitry therein that, in response to a second control signal, adjusts a pull-down delay characteristic of the second logic gate by reducing an effective on-state impedance of a second pull-down path therein when an output of said second logic gate is being pulled from a logic 1 value to a logic 0 value by the second pull-down path;
wherein the first and second control signals are complementary data signals; and
wherein the latching signal is a clock signal;
wherein the first logic gate comprises a first pair of MOS transistors connected source-to-drain in a first totem-pole arrangement;
wherein the first circuitry comprises a second pair of MOS transistors connected source-to-drain in a second totem-pole arrangement; and wherein the second totem-pole arrangement is connected in parallel with one of the MOS transistors in the first totem-pole arrangement.

9. The latch of claim 8, wherein a MOS transistor in the second totem-pole arrangement is responsive to one of the complementary data signals.

10. A multi-stage latch circuit, comprising:
a first logic gate having a first data input and an output and comprising first circuitry that adjusts a pull-down delay characteristic and/or pull-up delay characteristic of said first logic gate in response to a first control signal;
a second logic gate having a first data input and an output electrically coupled to the output and the first data input of said first logic gate, respectively;
a third logic gate having a first data input electrically coupled to the output of said first logic gate, a second data input and an output; and
a fourth logic gate having a first data input electrically coupled to the output of said second logic gate, a second data input electrically coupled to the output of said third logic gate and an output electrically coupled to the second data input of said third logic gate.

11. A flip-flop circuit that latches data in response to a clock signal, comprising:
first and second delay stages having respective input terminals that receive the clock signal; and
a first latch circuit comprising a first logic gate having a first input terminal that receives a signal output by the said first delay stage and a second logic gate having a first input terminal that receives a signal output by said second delay stage;
wherein an output of the first logic gate is connected to a second input of the second logic gate and an output of the second logic gate is connected to a second input of the first logic gate;
wherein either the delay time of said first delay stage or the delay time of said second delay stage is controlled by the data and varies; and
wherein the flip-flop circuit further comprises a second latch circuit for latching a signal output from the output of the first logic gate and a signal output from the output of the second logic gate.

12. A flip-flop circuit that latches data in response to a clock signal, comprising:
first and second delay stages having respective input terminals that receive the clock signal; and
a first latch circuit comprising a first logic gate having a first input terminal that receives a signal output by the said first delay stage and a second logic gate having a first input terminal that receives a signal output by said second delay stage;
wherein an output of the first logic gate is connected to a second input of the second logic gate and an output of the second logic gate is connected to a second input of the first logic gate;
wherein either the delay time of said first delay stage or the delay time of said second delay stage is controlled by the data and varies; and
wherein each of the first and second delay stages includes a one bit digital-to-time converter (DTC).

13. A digital magnitude comparator that compares a magnitude of a first digital signal with a magnitude of a second digital signal in response to a clock signal, comprising:
first and second delay stages having respective input terminals that receive the clock signal; and
a first latch circuit comprising a first logic gate having a first input terminal that receives a signal output by the said first delay stage and a second logic gate having a first input terminal that receives a signal output by said second delay stage;
wherein an output of the first logic gate is connected to a second input of the second logic gate and an output of the second logic gate is connected to a second input of the first logic gate;
wherein a delay time of the first delay stage is controlled by the first digital signal and varies and a delay time of the second delay stage is controlled by the second digital signal and varies; and
wherein the digital magnitude comparator further comprises a second latch circuit for latching a signal output from the output of the first logic gate and a signal output from the output of the second logic gate.

14. A digital magnitude comparator that compares a magnitude of a first digital signal with a magnitude of a second digital signal in response to a clock signal, comprising:
first and second delay stages having respective input terminals that receive the clock signal; and
a first latch circuit comprising a first logic gate having a first input terminal that receives a signal output by the said first delay stage and a second logic gate having a first input terminal that receives a signal output by said second delay stage;
wherein an output of the first logic gate is connected to a second input of the second logic gate and an output of the second logic gate is connected to a second input of the first logic gate;
wherein a delay time of the first delay stage is controlled by the first digital signal and varies and a delay time of the second delay stage is controlled by the second digital signal and varies; and
wherein each of the first and second delay stages comprises a N (N is a natural number) bit DTC.

15. An analog voltage comparator that compares a magnitude of a first analog voltage with a magnitude of a second analog voltage in response to a clock signal, comprising:
first and second delay stages having respective input terminals that receive the clock signal; and
a first latch circuit comprising a first logic gate having a first input terminal that receives a signal output by the said first delay stage and a second logic gate having a first input terminal that receives a signal output by said second delay stage;
wherein an output of the first logic gate is connected to a second input of the second logic gate and an output of the second logic gate is connected to a second input of the first logic gate;
wherein a delay time of the first delay stage is controlled by the first analog voltage and varies and a delay time of the second delay stage is controlled by the second analog voltage and varies; and
wherein the analog voltage comparator further comprises a second latch circuit for latching a signal output from the output terminal of the first logic gate and a signal output from the output terminal of the second logic gate.

16. An analog voltage comparator for comparing the magnitude of a first analog voltage with the magnitude of a second analog voltage in response to a clock signal, comprising:

first and second delay stages having respective input terminals that receive the clock signal; and a first latch circuit comprising a first logic gate having a first input terminal that receives a signal output by the said first delay stage and a second logic gate having a first input terminal that receives a signal output by said second delay stage;

wherein an output of the first logic gate is connected to a second input of the second logic gate and an output of the second logic gate is connected to a second input of the first logic gate;

wherein a delay time of the first delay stage is controlled by the first analog voltage and varies and a delay time of the second delay stage is controlled by the second analog voltage and varies; and wherein each of the first and second delay stages comprises a voltage-to-time converter (VTC).

17. An integrated circuit latch, comprising:

a pair of logic gates that each have first and second data inputs and an output, with the first inputs electrically connected together and responsive to a latching signal and with each of the second inputs electrically connected to an output of the other logic gate in said pair, said pair of logic gates comprising a first logic gate having first circuitry therein that, in response to a first control signal, adjusts a delay characteristic of the first logic gate.

18. The latch of claim 17, wherein the first control signal is selected from the group consisting of a single-bit digital signal, a multi-bit digital signal and an analog signal.

19. An integrated circuit latch, comprising:

a pair of logic gates that each have first and second data inputs and an output, with the first inputs electrically connected together and responsive to a latching signal and with each of the second inputs electrically connected to an output of the other logic gate in said pair, said pair of logic gates comprising:

a first logic gate having first circuitry therein that, in response to a first control signal that does not influence a boolean operation performed by the first logic gate, adjusts a pull-down delay characteristic of the first logic gate by reducing an effective on-state impedance of a first pull-down path therein when an output of said first logic gate is being pulled from a logic 1 value to a logic 0 value by the first pull-down path.

20. An integrated circuit latch, comprising:

a pair of logic gates that each have first and second data inputs and an output, with the first inputs electrically connected together and responsive to a latching signal and with each of the second inputs electrically connected to an output of the other logic gate in said pair, said pair of logic gates comprising a first logic gate having first circuitry therein that, in response to a first control signal that does not influence a boolean operation performed by the first logic gate, adjusts a delay characteristic of the first logic gate.

* * * * *